US011316320B2

(12) United States Patent
Okada et al.

(10) Patent No.: US 11,316,320 B2
(45) Date of Patent: Apr. 26, 2022

(54) LASER LIGHT-SOURCE APPARATUS AND LASER PULSE LIGHT GENERATING METHOD

(71) Applicant: SPECTRONIX CORPORATION, Suita (JP)

(72) Inventors: Joji Okada, Suita (JP); Yosuke Orii, Suita (JP)

(73) Assignee: SPECTRONIX CORPORATION, Suita (JP)

( * ) Notice: Subject to any disclaimer, the term of this patent is extended or adjusted under 35 U.S.C. 154(b) by 373 days.

(21) Appl. No.: 16/607,209

(22) PCT Filed: Apr. 19, 2018

(86) PCT No.: PCT/JP2018/016192
§ 371 (c)(1),
(2) Date: Oct. 22, 2019

(87) PCT Pub. No.: WO2018/203483
PCT Pub. Date: Nov. 8, 2018

(65) Prior Publication Data
US 2020/0052458 A1     Feb. 13, 2020

(30) Foreign Application Priority Data

May 1, 2017     (JP) .............................. JP2017-090954

(51) Int. Cl.
*H01S 3/23*     (2006.01)
*H01S 3/10*     (2006.01)
(Continued)

(52) U.S. Cl.
CPC ........ *H01S 3/2316* (2013.01); *H01S 3/06754* (2013.01); *H01S 3/09415* (2013.01);
(Continued)

(58) Field of Classification Search
CPC .. H01S 3/2316; H01S 3/1001; H01S 3/06754; H01S 3/094076; H01S 3/09415; H01S 3/109; H01S 3/2333; H01S 5/062
See application file for complete search history.

(56) References Cited

U.S. PATENT DOCUMENTS

| 7,813,390 B2 | 10/2010 | Luo et al. |
| 2012/0275477 A1 | 11/2012 | Berendt et al. |

(Continued)

FOREIGN PATENT DOCUMENTS

| JP | 2006-324613 A | 11/2006 |
| JP | 2013-102088 A | 5/2013 |

(Continued)

OTHER PUBLICATIONS

Nov. 5, 2019 International Preliminary Report on Patentability issued in International Patent Application No. PCT/JP2018/016192.
(Continued)

*Primary Examiner* — Eric L Bolda
(74) *Attorney, Agent, or Firm* — Oliff PLC

(57) ABSTRACT

A laser light-source apparatus includes a seed light source 10, fiber amplifiers 20 and 30 and a solid state amplifier 50 configured to amplify pulse light output from the seed light source, nonlinear optical elements 60 and 70 configured to perform wavelength conversion on the pulse light output from the solid state amplifier 50 and output the resultant pulse light, a semiconductor optical amplifier 15 disposed between the seed light source 10 and the solid state amplifier 50 and configured to amplify the pulse light output from the seed light source 10, and a control unit 100 configured to execute gain switching control processing in which the seed light source 10 is driven at a desired pulse rate, and semiconductor optical amplifier control processing in which an injection current to the semiconductor optical amplifier 15 is controlled depending on the pulse rate of the seed light
(Continued)

source 10, and thus, generation of a giant pulse can be reliably prevented, regardless of the pulse rate of the seed light source.

20 Claims, 8 Drawing Sheets

(51) Int. Cl.
    *H01S 3/067*     (2006.01)
    *H01S 3/094*     (2006.01)
    *H01S 3/0941*     (2006.01)
    *H01S 3/109*     (2006.01)
    *H01S 5/062*     (2006.01)

(52) U.S. Cl.
    CPC ...... *H01S 3/094076* (2013.01); *H01S 3/1001* (2019.08); *H01S 3/109* (2013.01); *H01S 3/2333* (2013.01); *H01S 5/062* (2013.01)

(56) References Cited

U.S. PATENT DOCUMENTS

| | | | |
|---|---|---|---|
| 2014/0111799 A1* | 4/2014 | Lei | G01N 21/9501 |
| | | | 356/237.5 |
| 2014/0301417 A1 | 10/2014 | Kane | |
| 2015/0092807 A1* | 4/2015 | McComb | H01S 3/0057 |
| | | | 372/50.11 |
| 2017/0054268 A1 | 2/2017 | Okada et al. | |
| 2018/0129114 A1 | 5/2018 | Okada et al. | |

FOREIGN PATENT DOCUMENTS

| | | |
|---|---|---|
| JP | 2016-051897 A | 4/2016 |
| WO | 2015/122374 A2 | 8/2015 |
| WO | 2016/125919 A2 | 8/2016 |

OTHER PUBLICATIONS

Jul. 10, 2018 International Search Report issued in International Patent Application No. PCT/JP2018/016192.

* cited by examiner

Fig.6A
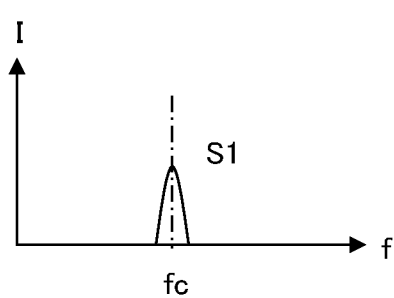
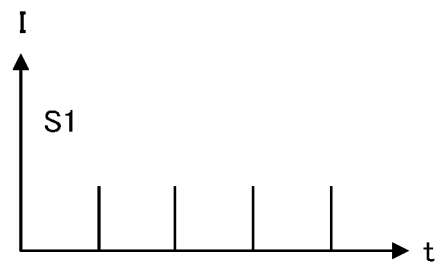
Fig.6B
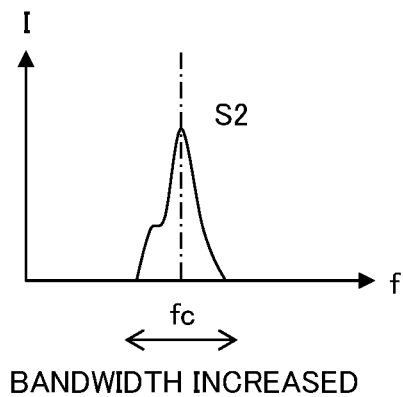
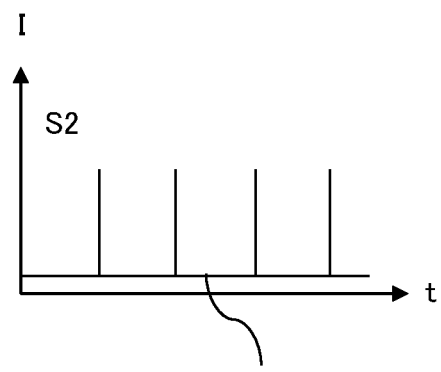
Fig.6C
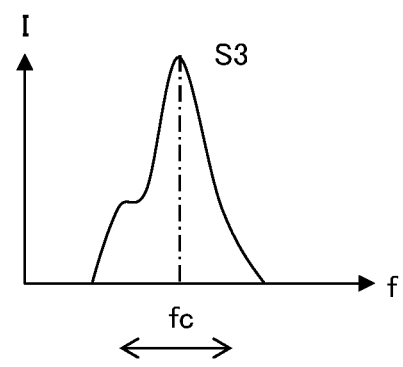
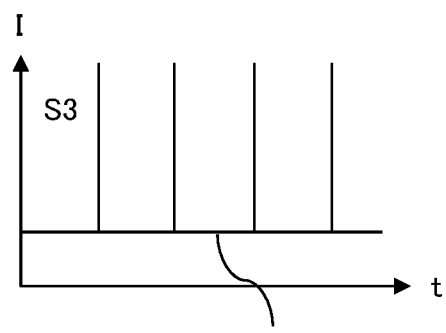

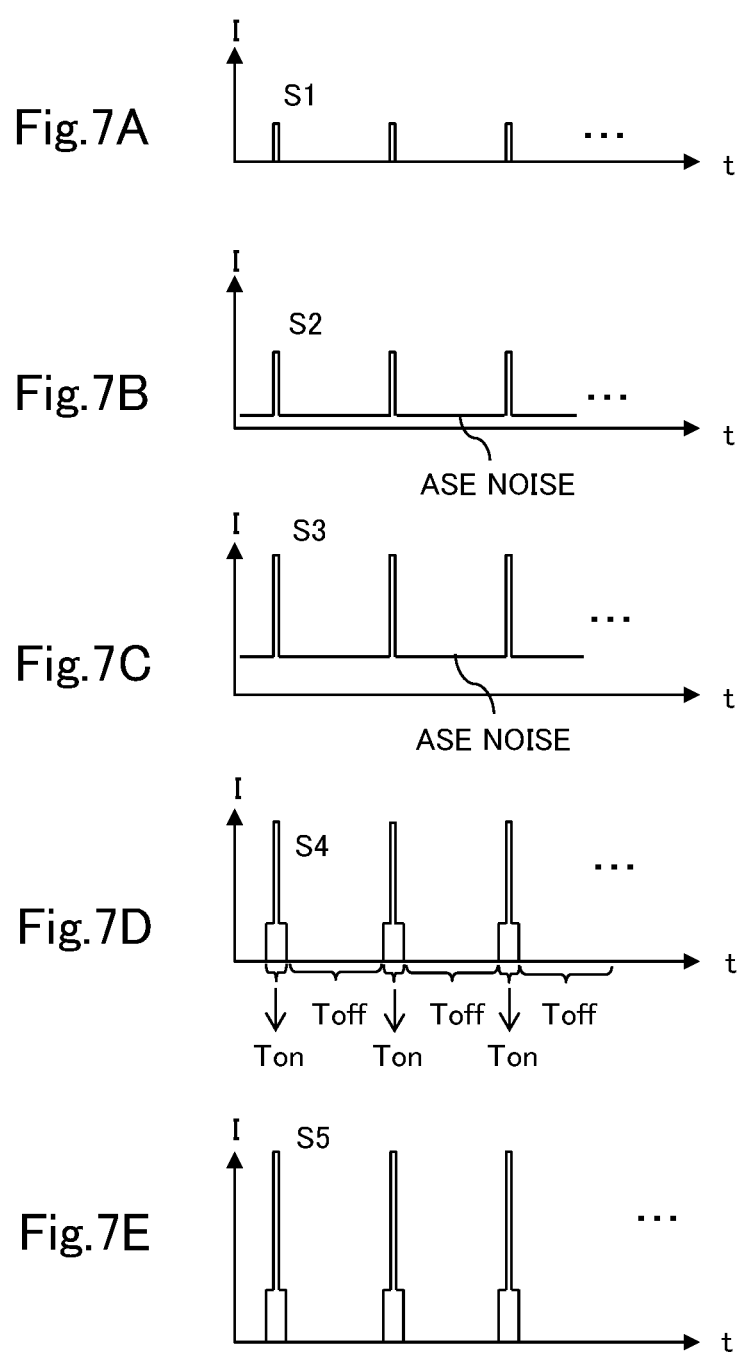

LASER LIGHT-SOURCE APPARATUS AND LASER PULSE LIGHT GENERATING METHOD

FIELD OF THE INVENTION

The present invention relates to a laser light-source apparatus and a laser pulse light generating method, used for various types of laser processing.

DESCRIPTION OF THE RELATED ART

Patent document 1 proposes a small and relatively low cost laser light-source apparatus in which a solid state amplifier amplifies pulse light with a higher energy efficiency and lower heat emission loss.

The laser light-source apparatus includes a seed light source configured to output pulse light based on gain switching, a fiber amplifier configured to amplify the pulse light output from the seed light source, a solid state amplifier configured to amplify the pulse light output from the fiber amplifier, a nonlinear optical element configured to perform wavelength conversion on the pulse light output from the solid state amplifier and output the resultant pulse light, an optical switching element disposed between the fiber amplifier and the solid state amplifier and configured to permit or stop propagation of the light from the fiber amplifier to the solid state amplifier, and a control unit.

The control unit is configured to execute gain switching control processing in which the seed light source is driven at a predetermined cycle, excitation control processing in which an excitation light source for the fiber amplifier and/or the solid state amplifier is periodically or intermittently controlled in such a manner that the fiber amplifier and/or the solid state amplifier enters a population inversion state before receiving the pulse light output from the seed light source, and optical switch control processing in which the optical switching element is controlled in such a manner that the propagation of the light is permitted in an output period of the pulse light from the seed light source, and stopped in a period other than the output period of the pulse light from the seed light source.

The optical switch control processing removes Amplified Spontaneous Emission (ASE) noise, which is spontaneously output optical noise generated during amplification by the fiber amplifier, in a time domain, and the excitation control processing reduces excessive excitation of the fiber amplifier and the solid state amplifier so as to prevent generation of a giant pulse.

PRIOR ART DOCUMENT

Patent Document

[Patent document 1] WO2015/122374

SUMMARY OF INVENTION

Problems to be Solved by the Invention

Unfortunately, when the excitation control processing is executed in a range with a high pulse rate of the pulse light output from the seed light source, the fiber amplifier and the solid state amplifier might not be sufficiently excited by the excitation light sources, and thus the pulse light might not be sufficiently amplified. In such a case, the wavelength converted light output from the nonlinear optical element might result in low intensity or output timing thereof might be delayed.

Moreover, when a semiconductor laser used as the excitation light source is intermittently driven depending on a variation of the pulse rate of the pulse light output from the seed light source, a wavelength shift due to temperature fluctuation of the semiconductor laser might occur. As a result, the fiber amplifier and the solid state amplifier might not enter appropriate excitation states. Such problems would be significant especially when the pulse rate of the pulse light is high.

In view of the problems described above, an object of the present invention is to provide a laser light-source apparatus and a laser pulse light generating method that can reliably prevent generation of a giant pulse regardless of a pulse rate of a seed light source.

Means for Solving the Problems

In order to achieve the object described above, a laser light-source apparatus according to the present invention includes a seed light source configured to output pulse light based on gain switching, a fiber amplifier configured to amplify the pulse light output from the seed light source, a solid state amplifier configured to amplify the pulse light output from the fiber amplifier, a nonlinear optical element configured to perform wavelength conversion on the pulse light output from the solid state amplifier and output the resultant pulse light, a semiconductor optical amplifier disposed between the seed light source and the solid state amplifier and configured to amplify the pulse light output from the seed light source, and further a control unit configured to execute gain switching control processing in which the seed light source is driven at a desired pulse rate and semiconductor optical amplifier control processing in which an injection current to the semiconductor optical amplifier is controlled depending on the pulse rate of the seed light source.

Moreover, a laser pulse light generating method according to the present invention includes sequentially amplifying the pulse light output from the seed light source based on gain switching by the fiber amplifier and the solid state amplifier, performing the wavelength conversion on the amplified pulse light by the nonlinear optical element and then outputting the resultant pulse light. The method further includes driving the seed light source at the desired pulse rate, and controlling the injection current to the semiconductor optical amplifier, disposed between the seed light source and the solid state amplifier, depending on the pulse rate of the seed light source.

Effects of Invention

As described above, the present invention can provide a laser light-source apparatus and a laser pulse light generating method that can reliably prevent generation of a giant pulse regardless of a pulse rate of a seed light source.

BRIEF DESCRIPTION OF THE DRAWINGS

FIGS. 6A to 6C are diagrams illustrating frequency and time axis characteristics of pulse light. FIG. 6A is a diagram illustrating pulse rate and time axis characteristics of narrowband pulse light output from a seed light source, and FIG. 6B and FIG. 6C are diagrams illustrating frequency and time axis characteristics of pulse light with a bandwidth increased due to self-phase modulation and Raman scattering in a fiber amplifier.

FIGS. 7A to 7E are diagrams illustrating pulse light. FIG. 7A is a diagram illustrating pulse light periodically output from the seed light source, FIG. 7B is a diagram illustrating pulse light in which ASE noise has been superimposed in an upstream stage fiber amplifier, FIG. 7C is a diagram illustrating pulse light in which ASE noise has been further superimposed in a downstream stage fiber amplifier, FIG. 7D is a diagram illustrating pulse light passing through an optical switching element in synchronization with an oscillation period of the seed light source in a time domain, and FIG. 7E is a diagram illustrating pulse light amplified by a solid state amplifier after passing through the optical switching element in synchronization with the oscillation period of the seed light source in the time domain.

DESCRIPTION OF THE PREFERRED EMBODIMENTS

Figure 1:
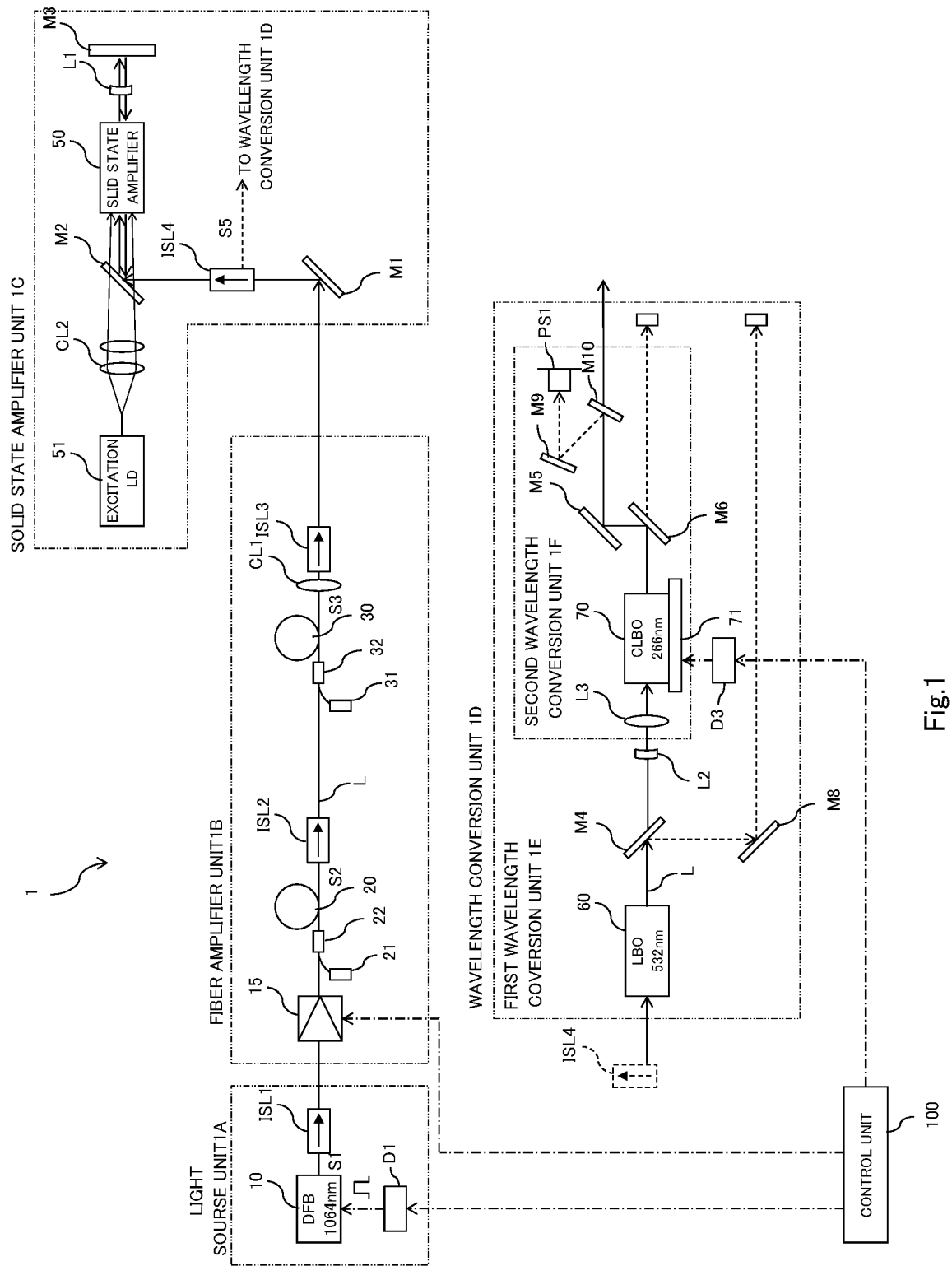
FIG. 1 is a block diagram of a laser light-source apparatus.

Embodiments of a laser light-source apparatus and a laser pulse light generating method according to the present invention are described below.

[Basic Aspect of Laser Light-Source Apparatus]

A laser light-source apparatus according to the present invention includes a seed light source configured to output pulse light based on gain switching, a fiber amplifier configured to amplify the pulse light output from the seed light source, a solid state amplifier configured to amplify the pulse light output from the fiber amplifier, a nonlinear optical element configured to perform wavelength conversion on the pulse light output from the solid state amplifier and output the resultant pulse light, a semiconductor optical amplifier disposed between the seed light source and the solid state amplifier and configured to amplify the pulse light output from the seed light source, and a control unit.

The control unit is configured to execute gain switching control processing in which the seed light source is driven at a desired pulse rate, and semiconductor optical amplifier control processing in which an injection current to the semiconductor optical amplifier is controlled depending on the pulse rate of the seed light source.

As the pulse rate of the pulse light output from the seed light source declines by the gain switching control processing, excitation time until the pulse light is input to the solid state amplifier becomes longer, which makes an excitation state of the solid state amplifier relatively higher. As the pulse rate of the pulse light output from the seed light source rises, the excitation time until the pulse light is input to the solid state amplifier becomes shorter, which makes the excitation state of the solid state amplifier relatively lower. That is, the excitation state of the solid state amplifier varies depending on the pulse rate of the seed light source.

Adjusting the injection current to the semiconductor optical amplifier enables variable adjustment of intensity of light output from the semiconductor optical amplifier, that is, intensity of output light including pulse light. Accordingly, by executing the semiconductor optical amplifier control processing described above, the excitation state of the solid state amplifier can be adjusted or the intensity of the pulse light to be input to the solid state amplifier can be adjusted to an appropriate value corresponding to the excitation state.

The semiconductor optical amplifier control processing includes processing in which injecting timing of the injection current is controlled in such a manner that the pulse light, output from the seed light source and subjected to the wavelength conversion by the nonlinear optical element, achieves predetermined intensity.

For example, when the injection current is injected into the semiconductor optical amplifier earlier than injecting timing required to amplify the pulse light output from the seed light source, continuous light having intensity corresponding to the injection current is output until the pulse light is amplified. The continuous light adjusts the excitation state of the solid state amplifier, so that the intensity of the pulse light, subjected to the wavelength conversion by the nonlinear optical element, can be adjusted to the predetermined intensity.

The semiconductor optical amplifier control processing preferably includes processing in which a value of the injection current is controlled in such a manner that the pulse light, output from the seed light source and subjected to the wavelength conversion by the nonlinear optical element, achieves the predetermined intensity.

By controlling the value of the injection current to the semiconductor optical amplifier, output light having adjusted intensity including pulse light corresponding to the seed light output from the semiconductor optical amplifier is input to the solid state amplifier. As a result, the intensity of the pulse light, subjected to the wavelength conversion by the nonlinear optical element, can be adjusted to the predetermined intensity.

The semiconductor optical amplifier control processing preferably includes processing in which the value of the injection current is controlled in such a manner that the solid state amplifier enters a predetermined excitation state.

Adjusting the value of the injection current to the semiconductor optical amplifier enables adjustment of the intensity of the continuous light output from the semiconductor optical amplifier. Then, by adjusting the intensity of the continuous light, the solid state amplifier can be adjusted to a preferable excitation state.

The semiconductor optical amplifier control processing preferably includes processing in which the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

As the pulse rate of the pulse light output from the seed light source declines by the gain switching control processing, the excitation time until the pulse light is input to the solid state amplifier becomes longer, which makes the excitation state of the solid state amplifier relatively higher. As the pulse rate of the pulse light output from the seed light source rises, the excitation time until the pulse light is input to the solid state amplifier becomes shorter, which makes the excitation state of the solid state amplifier relatively lower.

Accordingly, by controlling the value of the injection current to rise in a stepwise manner or continuously when no pulse light is input as the pulse rate of the seed light source declines, an excessive excitation state is reduced by the continuous light output from the semiconductor optical amplifier. By controlling the value of the injection current to decline in a stepwise manner or continuously when no pulse light is input as the pulse rate of the seed light source rises, unnecessary decline of the excitation state by the continuous light output from the semiconductor optical amplifier is prevented.

The gain switching control processing preferably includes processing in which the pulse rate of the seed light source is set in real time depending on the pulse light output from the nonlinear optical element, a processing target to be processed by the pulse light, and/or relative moving speed between the pulse light and the processing target. The semiconductor optical amplifier control processing preferably includes processing in which the injection current to the semiconductor optical amplifier is controlled depending on the pulse light output from the nonlinear optical element, the processing target to be processed by the pulse light, and/or the relative moving speed between the pulse light and the processing target.

It is preferable, in view of stable processing, that the pulse rate and the intensity of the pulse light output from the nonlinear optical element after the wavelength conversion be adjusted to appropriate values depending on the processing target and/or the relative moving speed between the pulse light and the processing target. In such a case, by setting the appropriate values to the pulse rate of the seed light source and the injection current to the semiconductor optical amplifier, a laser light-source apparatus that enables accurate processing in accordance with material characteristics of the processing target can be obtained.

The control unit is preferably configured to further execute excitation control processing in which an excitation light source for the fiber amplifier and/or the solid state amplifier is periodically or intermittently controlled in such a manner that the fiber amplifier and/or the solid state amplifier enters a population inversion state before receiving the pulse light output from the seed light source, when the pulse rate of the seed light source is equal to or lower than a predetermined frequency.

When the pulse rate of the seed light source is lower than the predetermined frequency, the fiber amplifier and the solid state amplifier might be excessively excited, which might make it difficult to properly prevent generation of a giant pulse even by the semiconductor optical amplifier control processing described above. In such a case, execution of the excitation control processing can adjust the fiber amplifier and the solid state amplifier to an appropriate population inversion state, so that generation of a giant pulse can be prevented.

Note that when the excitation control processing is executed when the pulse rate of the seed light source is higher than the predetermined frequency, the fiber amplifier and the solid state amplifier might not be sufficiently excited, which might cause delay in response, as described above. However, such ill effect does not occur when the pulse rate of the seed light source is lower than the predetermined frequency.

The laser light-source apparatus preferably further includes an optical switching element disposed between the fiber amplifier and the solid state amplifier and configured to permit or stop propagation of the light from the fiber amplifier to the solid state amplifier. The control unit is preferably configured to further execute optical switch control processing in which the optical switching element is controlled in such a manner that the propagation of the light is permitted in an output period of the pulse light from the seed light source, and stopped in a period other than the output period of the pulse light from the seed light source.

The pulse light is propagated from the fiber amplifier to the solid state amplifier via the optical switching element in the output period of the pulse light from the seed light source, and the propagation of the output light from the fiber amplifier to the solid state amplifier is stopped in the period other than the output period of the pulse light. Propagation of ASE noise to the solid state amplifier is stopped in the period other than the output period of the pulse light, and thus wasteful energy consumption in an active region of the solid state amplifier is prevented. In this manner, the optical switching element functions as a filter that removes the ASE noise in a time domain.

The seed light source preferably includes a distributed feedback (DFB) laser, and the control unit is preferably configured to drive the DFB laser at a pulse rate of several megahertz or lower and with a pulse width of several hundreds of picoseconds or shorter.

When the DFB laser employing the gain switching is used as the seed light source, single longitudinal mode pulse light having higher intensity than in a normal state can be obtained. With the gain switching, pulse light with a monochromatic wave or a desired pulse rate that is several megahertz or lower and having a desired pulse width that is several hundreds of picoseconds or shorter can be easily generated. By using the optical switching element and the semiconductor optical amplifier described above for the pulse light, pulse light with a higher average output and a desired wavelength can be efficiently obtained.

[Basic Aspect of Laser Pulse Light Generating Method]

A laser pulse light generating method according to the present invention includes sequentially amplifying pulse light output from a seed light source based on gain switching by a fiber amplifier and a solid state amplifier, performing wavelength conversion on the amplified pulse light by a nonlinear optical element and then outputting the resultant pulse light. The method further includes driving the seed light source at a desired pulse rate, and controlling an injection current to a semiconductor optical amplifier, disposed between the seed light source and the solid state amplifier, depending on the pulse rate of the seed light source.

Injecting timing of the injection current is preferably controlled in such a manner that the pulse light, output from the seed light source and subjected to the wavelength conversion by the nonlinear optical element, achieves predetermined intensity.

A value of the injection current is preferably controlled in such a manner that the pulse light, output from the seed light source and subjected to the wavelength conversion by the nonlinear optical element, achieves the predetermined intensity.

The value of the injection current is preferably controlled in such a manner that the solid state amplifier enters a predetermined excitation state.

The value of the injection current is preferably controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

The pulse rate of the seed light source is preferably set and the injection current to the semiconductor optical amplifier is preferably controlled depending on the pulse light output from the nonlinear optical element, a processing target to be processed by the pulse light, and/or relative moving speed between the pulse light and the processing target.

[Specific Aspect of Laser Light-Source Apparatus]

FIG. 1 illustrates an example of a configuration of a laser light-source apparatus 1 according to an embodiment of the present invention. The laser light-source apparatus 1 includes a light source unit 1A, a fiber amplifier unit 1B, a solid state amplifier unit 1C and a wavelength conversion unit 1D, which are disposed along an optical axis L, and further a control unit 100 configured to control the light source unit 1A and the like.

The light source unit 1A includes a seed light source 10, a driver D1 for the seed light source, an optical isolator ISL1 and the like. The fiber amplifier unit 1B includes: fiber amplifiers 20 and 30, in two stages, respectively including excitation light sources 21 and 31, each including a laser diode, and multiplexers 22 and 32; a semiconductor optical amplifier (SOA) 15 disposed on an upstream stage of the fiber amplifiers 20 and 30; optical isolators ISL2 and ISL3; an optical switching element 40; and the like.

The solid state amplifier unit 1C includes a solid state amplifier 50, reflection mirrors M1, M2, and M3, a lens L1, a collimator CL2, and the like. The wavelength conversion unit 1D includes a first wavelength conversion unit 1E and a second wavelength conversion unit 1F, respectively including nonlinear optical elements 60 and 70.

Laser pulse light (hereinafter, also simply referred to as "pulse light") with a wavelength of 1064 nm, output from the seed light source 10, is amplified by the semiconductor optical amplifier 15 and then by the fiber amplifiers 20 and 30 in the two stages, and is further amplified to a desired level by the solid state amplifier 50 in a single stage. The pulse light amplified by the solid state amplifier 50 is subjected to wavelength conversion by the nonlinear optical element 60 to have a wavelength of 532 nm, further subjected to wavelength conversion by the nonlinear optical element 70 to have a wavelength of 266 nm, and then is output.

The number of fiber amplifiers and solid state amplifiers are not particularly limited, and may be set as appropriate to achieve a desired amplification gain for the pulse light. For example, three fiber amplifiers may be cascaded, and two solid state amplifiers may be cascaded in a subsequent stage.

A distributed feedback laser diode (hereinafter, referred to as a "DFB laser") that outputs a single longitudinal mode laser light is used for the seed light source 10. The DFB laser outputs pulse light with a monochromatic wave or a desired pulse rate that is several megahertz or lower and having a desired pulse width that is several hundreds of picoseconds or shorter in response to a control signal output from the control unit 100 employing gain switching.

The pulse light, having a pulse energy of several to several hundreds of picojoules, output from the seed light source 10, is amplified by the fiber amplifiers 20 and 30 and the solid state amplifier 50 to have a final pulse energy of several tens of microjoules to several tens of millijoules. Then, the resultant pulse light is input to the two-stage nonlinear optical elements 60 and 70 to be subjected to the wavelength conversion. As a result, deep ultraviolet light with a wavelength of 266 nm is obtained.

The pulse light output from the seed light source 10 is amplified to a predetermined level by the semiconductor optical amplifier 15, through the optical isolator ISL1. The semiconductor optical amplifier 15 has the same configuration as that of a semiconductor laser except for processing applied to prevent reflection by an end face, and includes a control terminal for controlling an optical amplification gain.

The semiconductor optical amplifier includes an unsaturated region where the intensity of the pulse light, output in response to the increasing injection current input from the control terminal, rises, and a saturated region where the intensity of the pulse light, output in response to the increasing injection current, is saturated. By adjusting energy of the injection current to the semiconductor optical amplifier 15 in the unsaturated region, the pulse light to be input can be directly amplified to the desired intensity.

Figure 2:
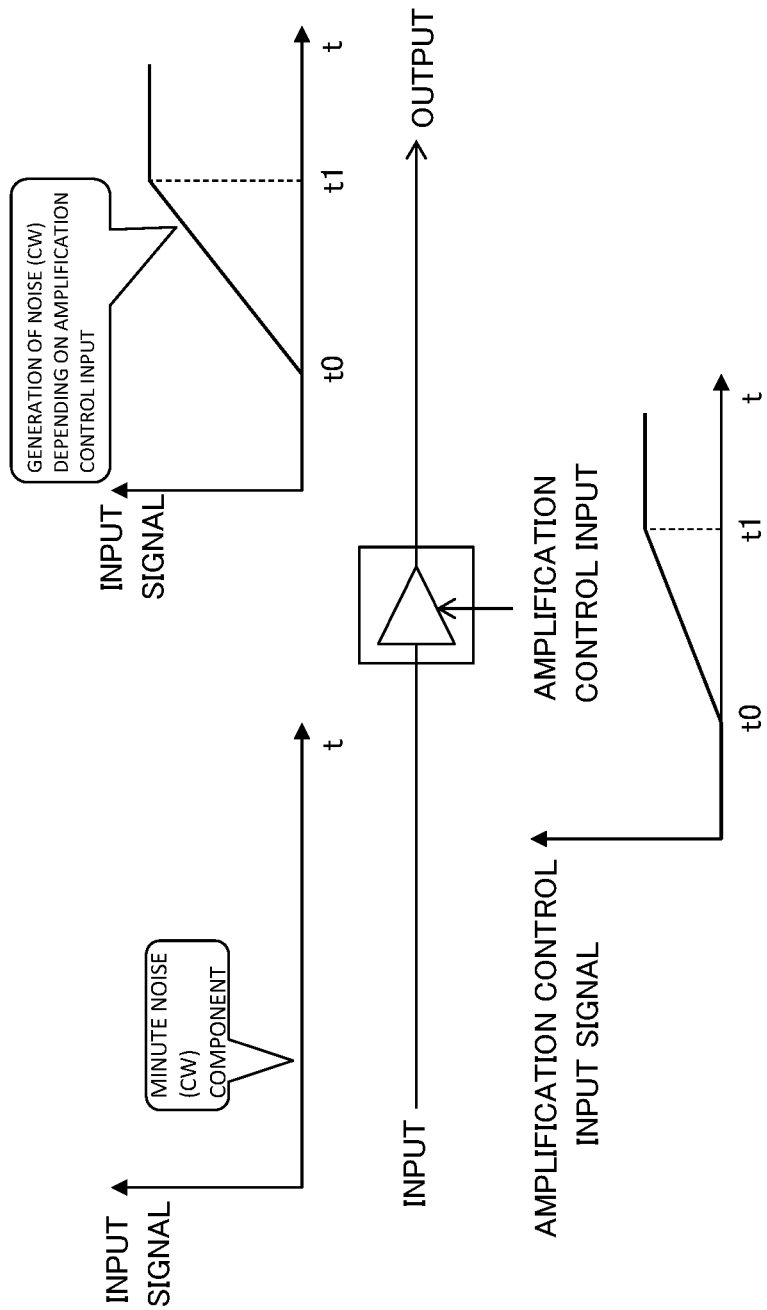
FIG. 2 is a diagram illustrating operation of a semiconductor optical amplifier.

FIG. 2 illustrates amplification characteristics of the semiconductor optical amplifier 15. When a value of the injection current, serving as an amplification control input signal, is raised in the unsaturated region at a time point t0 when no input signal (input light) is present, intensity of continuous light (CW light), which is output light, gradually rises depending on the value of the injection current. When reaching the saturated region at a time point t1, the intensity of the output light is saturated at a constant value. When the input signal is pulse light, pulse light amplified depending on the value of the injection current is output.

Returning to FIG. 1, the pulse light output from the semiconductor optical amplifier 15 is further amplified by the fiber amplifiers 20 and 30 in two stages. A rare-earth-doped optical fiber, such as an ytterbium (Yb)-doped fiber amplifier excited by the excitation light source 21 with a predetermined wavelength (for example 975 nm) is used for the fiber amplifiers 20 and 30. The population inversion of such a fiber amplifier 20 lasts for milliseconds, and thus energy excited by the excitation light source 21 is efficiently transferred to the pulse light having a frequency of 1 kilohertz or higher.

For example, the pulse light that has been amplified by the fiber amplifier 20 by about 30 decibels is input to the fiber amplifier 30 on the downstream stage through the optical isolator ISL2 to be amplified by about 25 decibels. The pulse light that has been amplified in the fiber amplifier 30 on the downstream stage is subjected to beam shaping by a collimator CL1, and then is guided to the solid state amplifier 50, after passing through the optical isolators ISL3 and ISL4, to be amplified by about 25 decibels.

According to the present embodiment, the collimator CL1 performs the beam shaping on the pulse light output from the fiber amplifier 30 in such a manner that a beam waist is positioned right in front of an incident surface of the solid state amplifier 50, whereby efficient optical amplification is achieved despite thermal lens effect in the solid state amplifier 50.

A pair of reflection mirrors M1 and M2 are disposed between the collimator CL1 and the solid state amplifier 50, and the optical isolator ISL4 which guides the pulse light, amplified in the solid state amplifier 50, to the nonlinear optical element 60 is disposed between the pair of reflection mirrors M1 and M2.

The optical isolators ISL1 to ISL4 described above are each a polarization-dependent optical isolator that blocks return light by rotating the plane of polarization to be in a reverse direction for a direction opposite to the forward direction, through magneto-optical effect. Thus, the optical isolators ISL1 to ISL4 are disposed, for example, to prevent optical elements disposed on the upstream side along the optical axis from breaking due to heat of the return light with high intensity.

A solid state laser medium such as a Nd:YVO4 crystal or a Nd:YAG crystal is preferably used for the solid state amplifier 50. The solid state laser medium is excited by excitation light output from an excitation light source 51, including a laser diode that emits light having a wavelength of 808 nm or 888 nm, and then is subjected to beam shaping by the collimator CL2.

The pulse light that has passed through the optical isolator ISL3 enters the solid state amplifier 50 via the reflection mirrors M1 and M2 to be amplified, and then is reflected by the reflection mirror M3 to reenter the solid state amplifier 50 to be amplified again. Thus, the pulse light is amplified while passing through the solid state amplifier 50 in opposite directions. The lens L1 is for beam shaping.

The first wavelength conversion unit 1E includes an LBO crystal ($LiB_3O_5$) serving as the nonlinear optical element 60, and the second wavelength conversion unit 1F includes a CLBO crystal ($CsLiB_6O_{10}$) serving as the nonlinear optical element 70. The pulse light, with a wavelength of 1064 nm, output from the seed light source 10, is subjected to the wavelength conversion in the nonlinear optical element 60 to have a wavelength of 532 nm, and then is subjected to the wavelength conversion in the nonlinear optical element 70 to have a wavelength of 266 nm.

Reflection mirrors M4 and M8 function as filters for separating the pulse light having a wavelength of 1064 nm output from the nonlinear optical element 60. A reflection mirror M6 functions as a filter for separating the pulse light having a wavelength of 532 nm output from the nonlinear optical element 70. Each pulse light thus separated is attenuated by an optical damper.

The second wavelength conversion unit 1F includes a stage 71 serving as a scanning mechanism that causes the CLBO crystal ($CsLiB_6O_{10}$) to move in a plane orthogonal to the optical axis, so that a position on the CLBO crystal ($CsLiB_6O_{10}$) irradiated with the pulse light is shifted at predetermined timing. This is because when the same position on the CLBO crystal ($CsLiB_6O_{10}$) is irradiated with ultraviolet light for a long period of time, the CLBO crystal ($CsLiB_6O_{10}$) is optically damaged to have intensity distribution and wavelength conversion output performance degraded.

The control unit 100 includes a circuit block including a Field Programmable Gate Array (FPGA), a peripheral circuit, and the like. A plurality of logical elements are driven based on a program stored in a memory in the FPGA in advance, so that, for example, blocks of the laser light-source apparatus 1 are sequentially controlled. The control unit 100 may employ a configuration including a microcomputer, a memory, and a peripheral circuit such as an TO or a configuration including a programmable logic controller (PLC), instead of the configuration including the FPGA.

Specifically, the control unit 100 is configured to execute gain switching control processing in which the seed light source 10 is driven at a predetermined pulse rate, semiconductor optical amplifier control processing in which the injection current to the semiconductor optical amplifier 15 is controlled depending on the pulse rate of the seed light source 10, excitation control processing in which the excitation light sources 21, 31 and/or 51 for the fiber amplifiers 20 and 30 and/or the solid state amplifier 50 are periodically or intermittently controlled in such a manner that the fiber amplifiers 20 and 30 and/or the solid state amplifier 50 enter a population inversion state before receiving the pulse light output from the seed light source 10, when a pulse cycle of the seed light source 10 is equal to or lower than a predetermined frequency, and the like.

[Specific Aspect of Laser Pulse Light Generating Method]

In the gain switching control processing, a trigger signal having a predetermined pulse width is transmitted to the driver D1 of the DFB laser serving as the seed light source 10 so that the seed light source 10 emits light based on gain switching. When pulse current, corresponding to the trigger signal, is applied to the DFB laser from a driving circuit, relaxation oscillation occurs. Here, a laser pulse light is output that includes only a first wave corresponding to the highest emission intensity immediately after the start of the light emission by the relaxation oscillation and includes no sub-pulses as a second wave and after. The gain switching is a method for thus generating pulse light with a short pulse width and large peak power through the relaxation oscillation.

When the pulse rate of the seed light source 10 is equal to or higher than a predetermined frequency, the excitation control processing is not executed and the excitation light sources 21, 31, and 51 are controlled to be constantly driven. Accordingly, the population inversion states, or the excitation states, of the fiber amplifiers 20 and 30 and the solid state amplifier 50 vary depending on the pulse rate of the pulse light.

The excitation states of the respective amplifiers 20, 30, and 50 are relatively higher in a case with a low pulse rate of the pulse light than in a case with a high pulse rate. Accordingly, when the pulse light with the same intensity enters, an amplification gain becomes higher as the excitation state is higher, and thus the intensity of the pulse light to be output becomes higher. When the respective amplifiers 20, 30, and 50 are excessively excited, pulse light with peak power extremely larger (hereinafter referred to as a "giant pulse") might be output from the solid state amplifier 50 to damage the solid state amplifier 50 and the nonlinear optical elements 60 and 70.

In order to prevent such a case, the semiconductor optical amplifier control processing in which the injection current to the semiconductor optical amplifier 15 is controlled depending on the pulse rate of the seed light source 10 is executed. As the pulse rate of the pulse light output from the seed light source 10 declines by the gain switching control processing, excitation time until the pulse light is input to the solid state amplifier 50 becomes longer, which makes the excitation state of the solid state amplifier 50 relatively higher. As the pulse rate of the pulse light output from the seed light source 10 rises, the excitation time until the pulse light is input to the solid state amplifier 50 becomes shorter, which makes the excitation state of the solid state amplifier 50 relatively lower.

That is, the excitation state of the solid state amplifier 50 varies depending on the pulse rate of the seed light source 10. Adjusting the injection current to the semiconductor optical amplifier 15 enables variable adjustment of the intensity of the light output from the semiconductor optical amplifier 15, that is, the intensity of the output light including the pulse light.

Accordingly, by executing the semiconductor optical amplifier control processing, the excitation state of the solid state amplifier 50 can be adjusted or the intensity of the pulse light to be input to the solid state amplifier 50 can be adjusted to an appropriate value corresponding to the excitation state. According to the present embodiment, the semiconductor optical amplifier 15 is disposed on the upstream stage of the fiber amplifier 20, whereby the excitation states of the fiber amplifiers 20 and 30, as well as that of the solid state amplifier 50, can be adjusted, or the intensity of the pulse light to be input to the fiber amplifiers 20 and 30 can be adjusted to the appropriate value corresponding to the excitation states.

Figure 3:
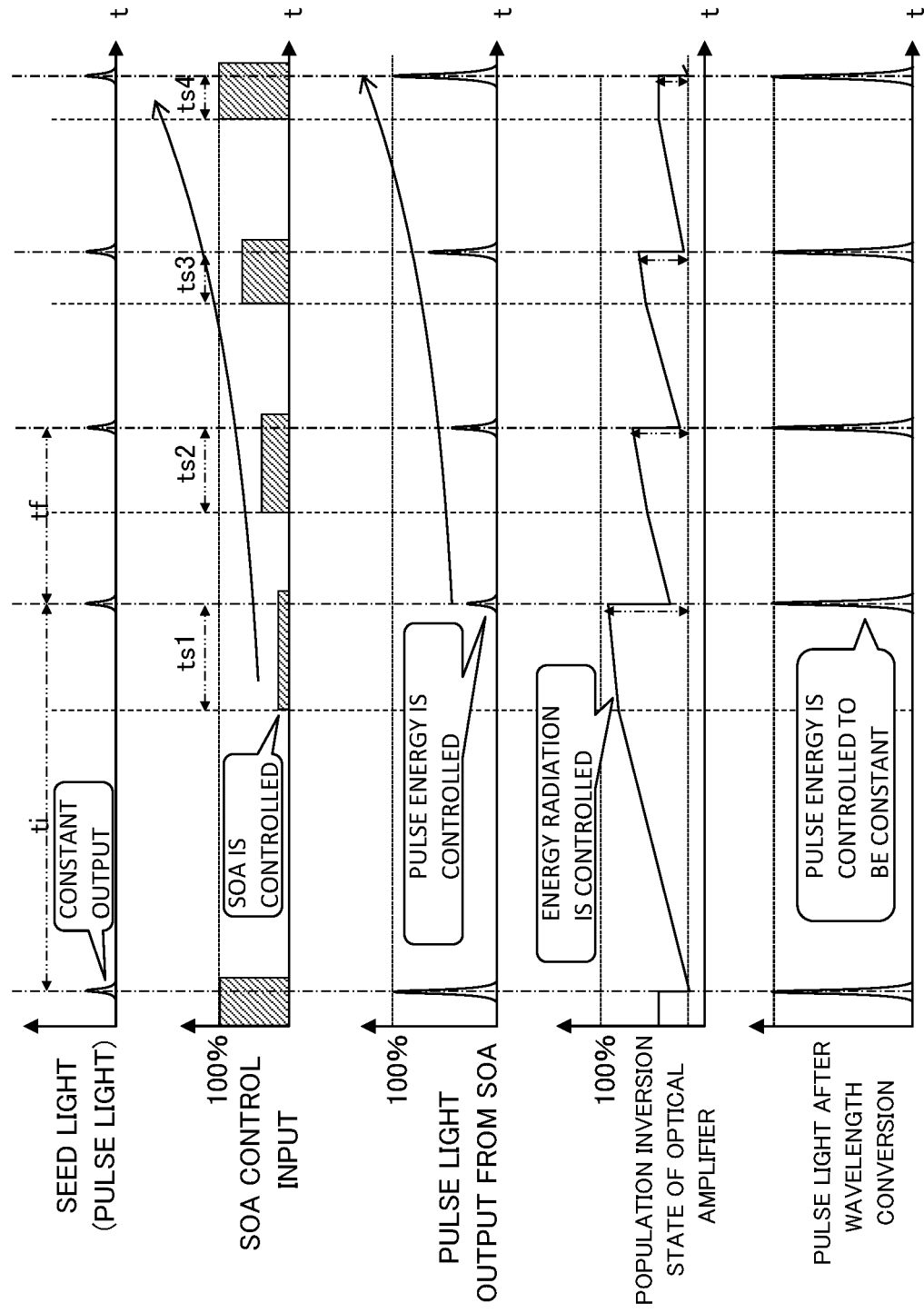
FIG. 3 is a diagram illustrating an example of semiconductor optical amplifier control processing.
Figure 4:
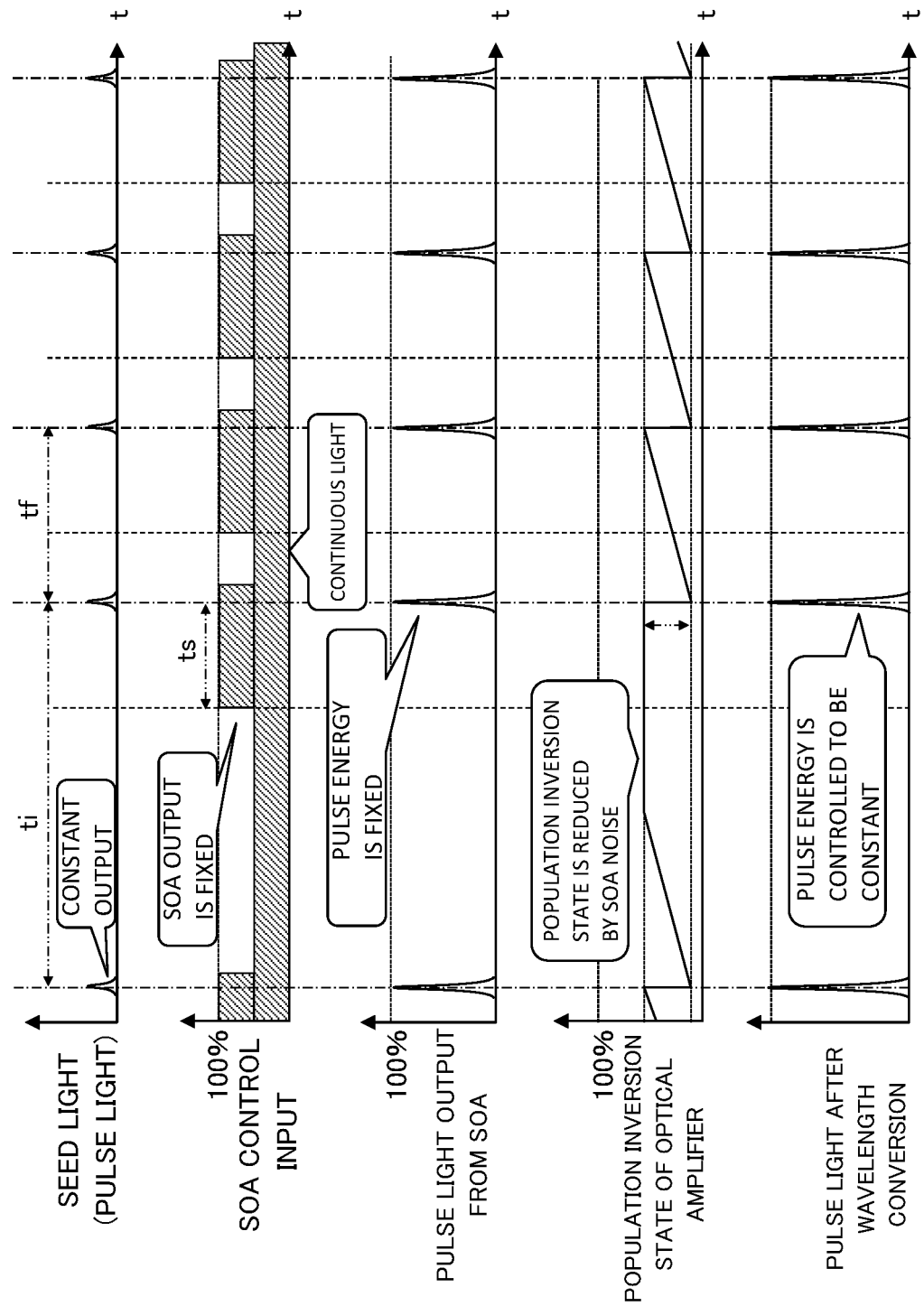
FIG. 4 is a diagram illustrating another example of semiconductor optical amplifier control processing.

FIG. 3 and FIG. 4 illustrate examples in which when the intensity of the pulse light output from the seed light source 10 by the gain switching control processing, that is, the intensity of the seed light, is constant, the intensity of the pulse light output from the nonlinear optical element 70 by the semiconductor optical amplifier control processing is controlled to be constant, regardless of the pulse cycles ti and tf.

In the example illustrated in FIG. 3, the semiconductor optical amplifier control processing includes processing in which the injecting timing of the injection current is controlled in such a manner that the pulse light, output from the seed light source 10 and subjected to the wavelength conversion by the nonlinear optical element 70, achieves the predetermined intensity (constant intensity in the present embodiment). The predetermined intensity may be set to dynamically vary instead of being constant.

For example, when the injection current is injected into the semiconductor optical amplifier 15 earlier than the injecting timing required to amplify the pulse light output from the seed light source 10, the continuous light having the intensity corresponding to the injection current is output until the pulse light is amplified, as described with reference to FIG. 2. The continuous light adjusts the excitation state of the solid state amplifier 50, so that the intensity of the pulse light, subjected to the wavelength conversion by the nonlinear optical element 70, can be adjusted to the predetermined intensity.

In addition, the semiconductor optical amplifier control processing includes processing in which the value of the injection current is controlled in such a manner that the pulse light, output from the seed light source 10 and subjected to the wavelength conversion by the nonlinear optical element 70, achieves the predetermined intensity.

By controlling the value of the injection current to the semiconductor optical amplifier 15, output light having adjusted intensity including pulse light corresponding to the seed light output from the semiconductor optical amplifier 15 is input to the solid state amplifier 50. As a result, the intensity of the pulse light, subjected to the wavelength conversion by the nonlinear optical element 70, can be adjusted to the predetermined intensity.

FIG. 3 illustrates an example in which both the injecting timing and the current value of the injection current to the semiconductor optical amplifier 15 are controlled by the semiconductor optical amplifier control processing. The excitation state of the solid state amplifier 50 is variably adjusted and the value of the injection current is adjusted in such a manner that the pulse light with the constant intensity corresponding to the excitation state is output from the solid state amplifier 50. As a result, the intensity of the pulse light, subjected to the wavelength conversion by the nonlinear optical element 70, is adjusted to be constant.

In an example illustrated in FIG. 4, the semiconductor optical amplifier control processing includes processing in which the value of the injection current is controlled in such a manner that the solid state amplifier 50 is adjusted to a predetermined excitation state (constant excitation state in the present embodiment). By adjusting the value of the injection current depending on the pulse rate of the seed light, the solid state amplifier 50 is adjusted to the constant excitation state, and the intensity of the pulse light, subjected to the wavelength conversion by the nonlinear optical element 70, is adjusted to be constant. Adjusting the intensity of the continuous light at this time enables adjustment of the excitation state of the solid state amplifier 50 to a preferable excitation state.

The value of the injection current to the semiconductor optical amplifier 15 is maintained to a constant value depending on the pulse rate of the seed light so as to maintain the excitation state of the solid state amplifier 50 constant. Then, in order to obtain a desired amplification gain coincidentally with amplification timing of the seed light, the value is raised in a stepwise manner immediately before the input timing of the seed light by time ts and returns to the previous value after completion of the amplification processing. When the pulse rate of the seed light is high, the value of the injection current is lowered. When the pulse rate of the seed light is low, the value of the injection current is raised.

When the excitation state is set to dynamically vary instead of being constant, the intensity of the wavelength converted light can be dynamically adjusted.

That is, the semiconductor optical amplifier control processing preferably includes processing in which the value of the injection current is controlled when no pulse light is input in such a manner that the value is raised in a stepwise manner or continuously as the pulse rate of the pulse light output from the seed light source 10 declines, and the value is lowered in a stepwise manner or continuously as the pulse rate of the pulse light output from the seed light source 10 rises.

Moreover, the control unit 100 is configured to further execute shift control processing in which the stage 71 is controlled to move in a stepwise manner so that the position of the CLBO crystal ($CsLiB_6O_{10}$) irradiated with the pulse light is shifted at a predetermined timing.

For example, in the shift control processing, intensity of the ultraviolet light that has been subjected to the wavelength conversion is monitored. When a history of the monitored intensity matches a predetermined pattern, the stage 71 is moved to shift the position on the CLBO crystal ($CsLiB_6O_{10}$) irradiated with the pulse light.

The stage 71 is coupled to an X direction movement motor and/or a Y direction movement motor, controlled by the control unit 100 via a motor driver D3, in a driving force transmittable manner, and thus is movable on an X-Y plane orthogonal to the optical axis of the pulse light.

[Other Embodiments of Laser Light-Source Apparatus]

Other embodiments of the laser light-source apparatus are described below.

The laser light-source apparatus 1 illustrated in FIG. 5 includes an Acousto-Optic Modulator (AOM) that includes an acousto-optic element and functions as the optical switching element 40 between the collimator CL1 and the solid state amplifier 50 of the laser light-source apparatus 1 described with reference to FIG. 1.

The control unit 100 is configured to execute optical switch control processing in which the optical switching element 40 is controlled in such a manner that the propagation of the light is permitted in an output period of the pulse light from the seed light source 10, and stopped in a period other than the output period of the pulse light from the seed light source 10, in addition to the gain switching control processing and the semiconductor optical amplifier control processing.

In the optical switch control processing, a gate signal is output to an RF driver D2 that drives the AOM serving as the optical switching element 40. A transducer (piezoelectric conversion element) that has received a high frequency signal from the RF driver D2 generates a diffraction grating in the crystal of the acousto-optic element, so that diffracted light of the pulse light that has entered the acousto-optic element is made incident on the reflection mirror M1.

When the RF driver D2 is stopped, the pulse light passes through the acousto-optic element without being diffracted, and thus is not made incident on the reflection mirror M1. The light that has passed through the acousto-optic element while the RF driver D2 is stopped is attenuated by the optical damper.

When the optical switching element 40 is turned ON by the gate signal, the diffracted light propagates to the solid state amplifier 50 from the fiber amplifier 30. When the optical switching element 40 is turned OFF by the gate signal, the propagation of the light to the solid state amplifier 50 from the fiber amplifier 30 is stopped.

In each of FIGS. 6A, 6B, and 6C, the frequency characteristics of the pulse light propagating in components of the laser light-source apparatus 1 are illustrated in a left side figure, and the time axis characteristics of the pulse light are illustrated in a right side figure. In the figures, the reference sign Sn (n is an integer) represents an optical signal Sn (n=1, 2 . . . ) from an output node of components of the laser light-source apparatus 1 illustrated in FIG. 1.

A laser pulse light having a narrow bandwidth with the center wavelength of 1064 nm (see FIG. 6A) is output from the DFB laser, serving as the seed light source 10, at a predetermined cycle, in response to the trigger signal output from the control unit 100. When the pulse light output from the seed light source 10 is guided by the fiber amplifier 20 and amplified, an unwanted spectrum width increase occurs due to self-phase modulation, Raman scattering, and the like. Furthermore, the ASE noise is produced, and thus a S/N ratio of the pulse light is degraded (see FIG. 6B). A further increase of the bandwidth and a further increase in the ASE noise level occur (see FIG. 6C) when the pulse light is guided to and amplified by the fiber amplifier 30 on the downstream stage. Note that a gain of the semiconductor optical amplifier 15 is one in this example.

The pulse light amplified by the fiber amplifiers 20 and 30 needs to be further amplified by the solid state amplifier 50 on the downstream stage to achieve larger peak power, so that the deep ultraviolet pulse light having predetermined intensity can be obtained. A range of wavelengths achievable by the wavelength conversion by the wavelength conversion unit 1D is limited by the characteristics of the nonlinear optical elements 60 and 70. Thus, the energy used for the amplification does not efficiently contribute to the wavelength conversion. All things considered, the wavelength conversion efficiency is low.

The excitation energy of the solid state amplifier 50 is wastefully consumed for the pulse light with an increased bandwidth and the amplified ASE noise. Thus, the energy efficiency is low. When the excitation energy is increased to offset the wastefully consumed amount, a large scale cooling device is required for preventing damages due to emitted heat on the elements. Thus, the cost of the laser light-source apparatus 1 increases. When the frequency of the pulse light is in the order of megahertz or higher, the ASE noise is so small that would not be much of a problem. The adverse effect of the ASE noise is large when the oscillating frequency of the pulse light is in a range lower than 1 megahertz.

The optical switching element 40 is controlled through the switch control processing described above, in such a manner that the propagation of light is permitted in the output period of the pulse light from the seed light source 10 and is stopped in a period other than the output period of the pulse light from the seed light source 10. Thus, an output permitted state is achieved where the output of the pulse light from the nonlinear optical elements 60 and 70 is permitted.

When the optical switching element 40 is turned OFF in the period other than the output period of the pulse light from the seed light source 10, the ASE noise is prevented from propagating to the solid state amplifier 50 on the downstream stage. As a result, the energy in an active region of the solid state amplifier 50 is prevented from being wastefully consumed (see a section Toff in FIG. 7D).

Then, after the optical switching element 40 is turned ON by the control unit 100 in the output period of the pulse light from the seed light source 10, the pulse light propagates from the fiber amplifier 30 to the solid state amplifier 50 (see a section Ton in FIG. 7D). Thus, the pulse light is amplified with a high energy efficiency (see FIG. 7E), and the pulse light with large peak power is output from the nonlinear optical elements 60 and 70. In this manner, the optical switching element 40 functions as a filter that removes the ASE noise in a time domain.

The "output period of the pulse light from the seed light source", in which the optical switching element 40 is ON due to the control performed by the control unit 100, is not necessarily the entire output period of the pulse light from the seed light source, and may be a part of such a period as long as the peak power of the pulse light, obtained by the wavelength conversion by the nonlinear optical element, can be within a range of appropriate values. Furthermore, the concept of the period includes short periods before and after the output period of the pulse light from the seed light source.

The "period other than the output period of the pulse light from the seed light source", in which the optical switching element 40 is OFF due to the control performed by the control unit 100, in the output permitted state is not necessarily the entire period including all the periods between the output periods of the plurality of pulse light beams, that is, periods without the pulse light, and may be a part of such periods as long as the energy in the active region of the solid state amplifier, as a result of the excitation by the excitation light source, is not largely consumed for the ASE noise.

An electro-optic element that turns ON and OFF light with an electric field in accordance with intensity modulation through EO modulation may be used as the optical switching element. An extremely small rocking mirror, made by a micromachining technique (a mirror including Micro Electro Mechanical Systems (MEMS)), may be used as the optical switching element 40. Here, the propagation of the output from the fiber amplifier 30 to the solid state amplifier 50 may be permitted or stopped by switching a rocking angle of the extremely small rocking mirror. Furthermore, a polarization device that can control transmission and blocking of light by dynamically switching a polarization state may be used. In other words, the optical switching element may include a dynamic optical element.

An ASE noise removing effect of the optical switching element 40 is large when the pulse rate of the pulse light output from the seed light source 10 is 1 megahertz or lower, and is particularly large when the frequency is several hundreds of kilohertz or lower, more particularly, 200 kilohertz or lower.

Figure 5:
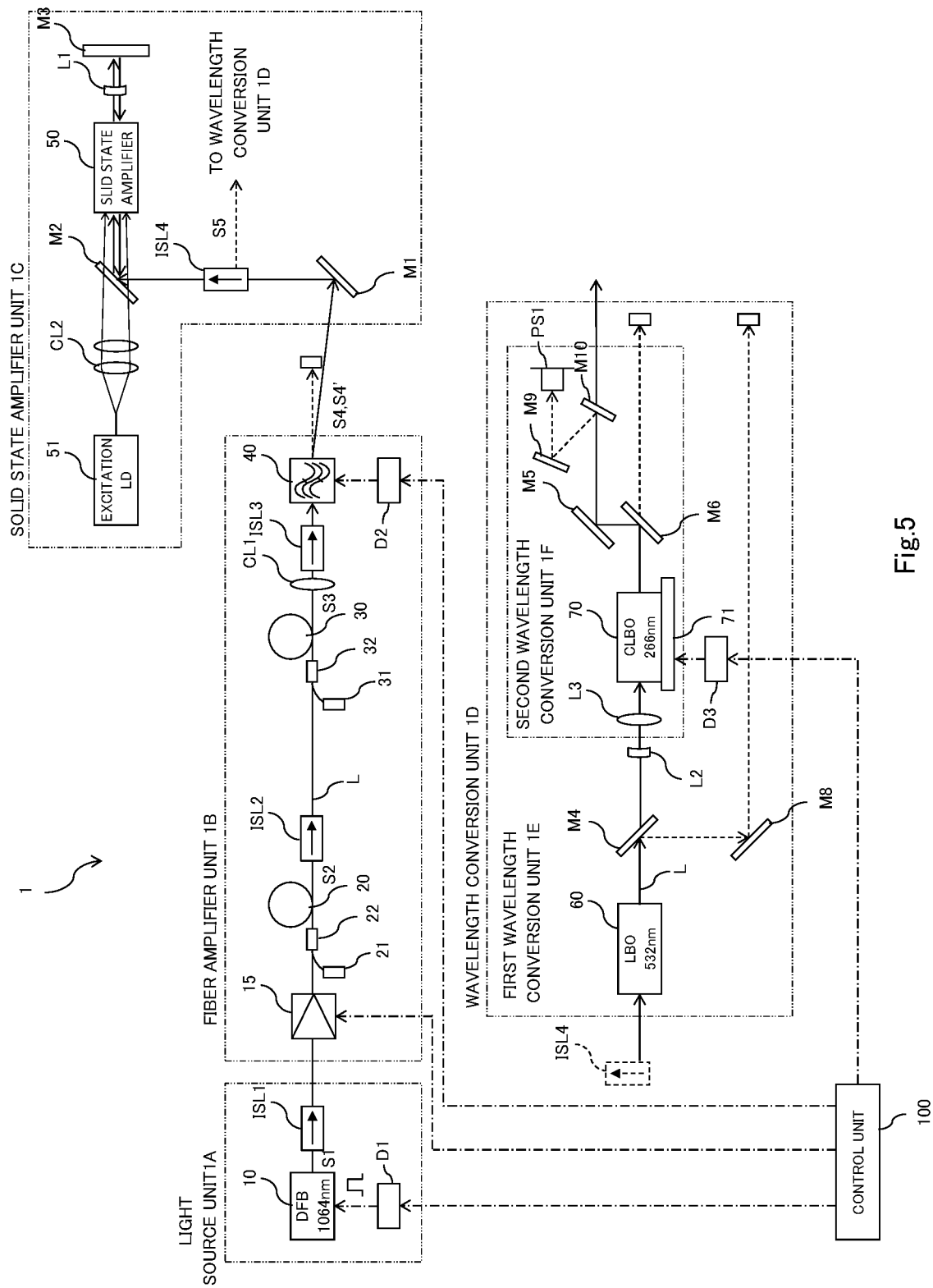
FIG. 5 is a block diagram of a laser light-source apparatus according to another embodiment.
Figure 8:
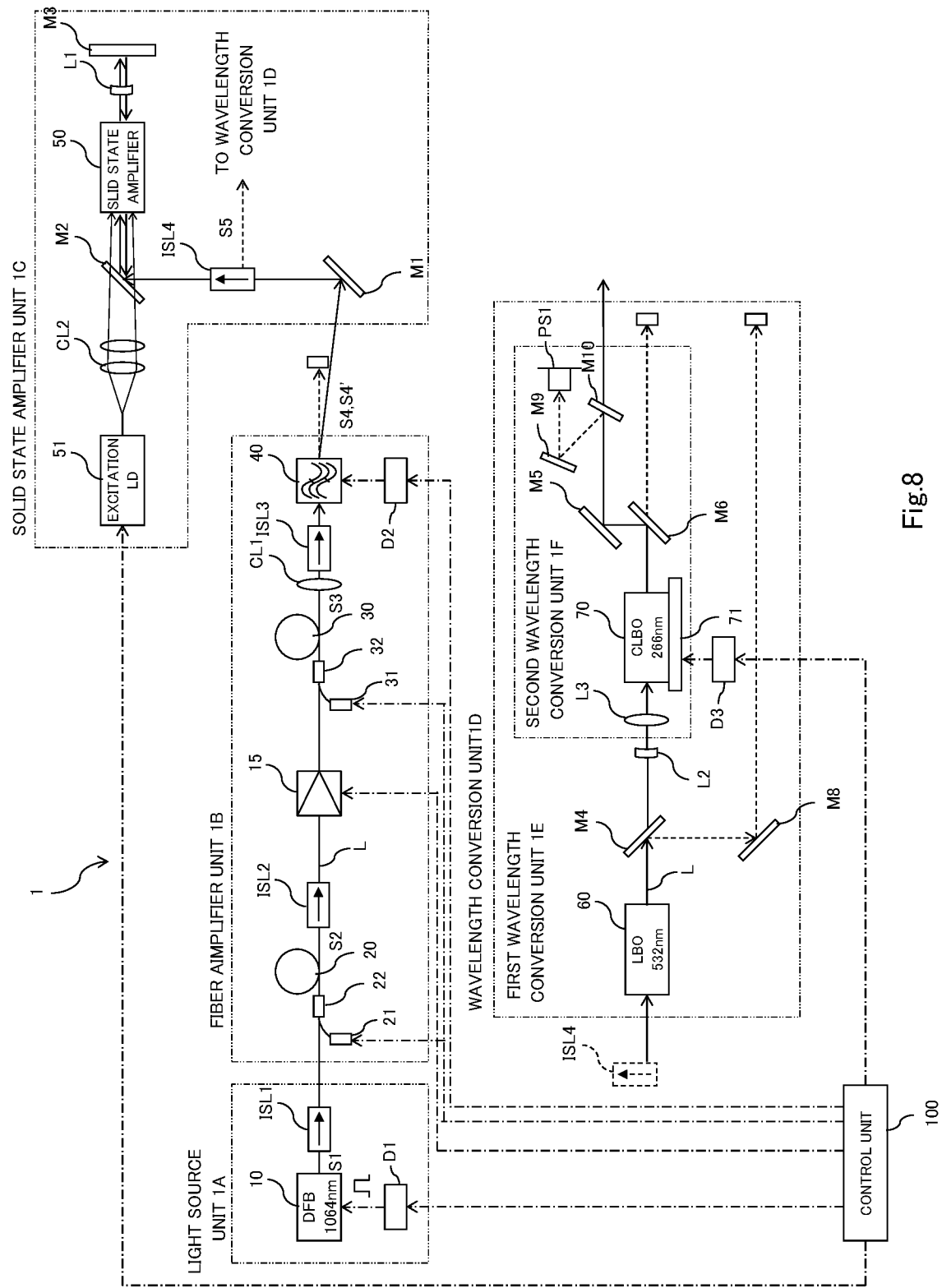
FIG. 8 is a block diagram illustrating a laser light-source apparatus according to the other embodiment.

FIG. 8 illustrates an example of the laser light-source apparatus 1 in which the semiconductor optical amplifier 15 of the laser light-source apparatus 1, described with reference to FIG. 5, is disposed between the fiber amplifiers 20 and 30, and the excitation light sources 21, 31, and 51 for the fiber amplifiers 20 and 30 and the solid state amplifier 50 are configured to be controllable.

The semiconductor optical amplifier 15 may be disposed between the fiber amplifier 20 and the fiber amplifier 30, and a plurality of semiconductor optical amplifiers 15 may be respectively disposed between the seed light source 10 and the fiber amplifier 20 and between the fiber amplifier 20 and the fiber amplifier 30. In a configuration employing the fiber amplifiers in several stages, the semiconductor optical amplifier may be disposed on the upstream stage of the fiber amplifier on the upstream stage, or in a middle stage of the fiber amplifiers. Alternatively, a plurality of semiconductor optical amplifiers may be disposed at any of the stages.

In this example, the control unit 100 executes the excitation control processing in which the excitation light sources 21, 31, and/or 51 for the fiber amplifiers 20 and 30 and/or the solid state amplifier 50 are periodically or intermittently controlled in such a manner that the fiber amplifiers 20 and 30 and/or the solid state amplifier 40 enter a population inversion state before receiving the pulse light output from the seed light source 10, when the pulse cycle of the seed light source 10 is equal to or lower than the predetermined frequency.

When the pulse light is not input to the fiber amplifiers 20 and 30 and the solid state amplifier 50, the excitation light sources are not unnecessarily driven, so that the amplifiers emit less heat. In the present embodiment, the excitation light sources 21, 31, and 51 are driven earlier than an ON timing of the seed light source 10 at least by a predetermined excitation start period, and is turned OFF at an OFF timing of the seed light source 10 or when a predetermined excitation end period elapses after the ON timing of the seed light source 10.

The excitation start period is a value determined in accordance with a fluorescent lifetime of each of the amplifiers 20, 30, and 50, and is set to be a value that is 0.5 to 3 times a fluorescent lifetime $\tau$, for example. The fluorescent lifetime differs among the amplifiers 20, 30, and 50. Thus, the driving control needs to be individually performed for the excitation light sources 21, 31, and 51 of the respective amplifiers 20, 30, and 50. To simplify the driving circuit for the excitation light sources 21, 31, and 51, the excitation start period of the amplifier with the longest fluorescent lifetime may be applied to the other amplifiers.

The excitation control processing is preferably executed when the pulse rate of the seed light source 10 is several hundreds of kilohertz or lower, especially 200 kilohertz or lower. Constant driving of the excitation light sources at such a pulse rate causes an excessive excitation state of the fiber amplifiers 20 and 30 and the solid state amplifier 50, so that execution of the semiconductor optical amplifier control processing may not be enough to deal with it. The excitation control processing is useful in such a case.

The excitation light sources 21, 31, and 51 are periodically or intermittently controlled in such a manner that the fiber amplifiers 20 and 30 and the solid state amplifier 50 enter the population inversion state, which is an energy state where the amplification can be performed, before the fiber amplifiers 20 and 30 and the solid state amplifier 50 receive the pulse light. Thus, the excitation light sources are not unnecessarily driven with no pulse light received, so that the amplifiers emit less heat.

Driving cycles of the excitation light sources 21, 31, and 51 are determined to be synchronized with a driving cycle of the seed light source 10, and thus the excitation light sources 21, 31, and 51 stop when the seed light source 10 stops. Thus, no large excitation state is achieved before the subsequent driving of the seed light source 10, whereby no giant pulse with extremely large peak power is output, which could damage a wavelength conversion device and the like with heat. Even when the seed light source 10 is periodically driven, no ASE noise is produced at least when the excitation light sources 21, 31, and 51 are OFF. Thus, the SN ratio of the pulse light does not largely degrade.

The present invention is widely applicable to laser light-source apparatuses that use a seed light source that is driven by a frequency of several hundreds of megahertz or lower and with the pulse width of several hundreds of picoseconds or shorter, as semiconductor lasers including a DFB laser.

[Another Embodiment of Semiconductor Optical Amplifier Control Processing]

Another embodiment of the semiconductor optical amplifier control processing to be executed by the control unit is described below.

The pulse rate of the pulse light is preferably varied depending on the pulse light output from the nonlinear optical element, the processing target to be processed by the pulse light, and/or the relative moving speed between the pulse light and the processing target, and the injection current to the semiconductor optical amplifier is preferably controlled depending on the pulse rate.

In such a manner, pulse light with optimum energy for the characteristics of the processing target can be irradiated, and pulse light with optimum energy depending on the relative moving speed between the processing target and the pulse light can be irradiated.

For example, when a through hole is formed by irradiation of the pulse light in a plate body, such as a liquid crystal panel, in which a glass substrate, an adhesive layer made of a sapphire thin film, and a protective layer made of a polyamide resin are laminated, pulse light with a large diameter and large power is irradiated on the protective layer, pulse light with a small diameter and small power is irradiated on the adhesive layer, and pulse light with large power is irradiated on the glass substrate. The semiconductor optical amplifier control processing is suitably employed when power adjustment of the pulse light, subjected to the wavelength conversion, is needed depending on the processing target.

Moreover, when the processing target is irradiated while moving relative to the pulse light, and the moving speed of the processing target varies between cases of linear movement and curvilinear movement, the pulse rate of the pulse light is lowered in the curvilinear movement case, where the moving speed is low, and the pulse light energy is also adjusted, and the pulse rate of the pulse light is raised in the linear movement case, where the moving speed is high, and the pulse light energy is also adjusted. The semiconductor optical amplifier control processing is also suitably employed in such a case. It is a matter of course that the pulse rate of the pulse light should be adjusted by the gain switching control processing.

When the pulse light is output from the seed light source 10 at a predetermined frequency by irregular gain switching processing while the excitation light source is constantly driven without executing the excitation control processing at all, execution of the semiconductor optical amplifier control processing can prevent generation of a giant pulse.

In this case, even when the gain switching processing is executed with a constant pulse rate, the excitation states of the fiber amplifiers and the solid state amplifier are different between a first time after a long pause and a second time and after. Thus, by setting the value of the injection current to the semiconductor optical amplifier at the first time relatively higher than that at the second time and after, the intensity of the pulse light output from the solid state amplifier can be stably adjusted to objective intensity.

In the embodiments described above, examples are described where the DFB laser is used as the seed light source and employs the gain switching to generate single longitudinal mode pulse light having higher intensity than in a normal state. In the present invention, any semiconductor laser may be used as the seed light source, and thus a general Fabry-Perot semiconductor laser other than the DFB laser may be used.

The present invention is not limited to the seed light source with an oscillation wavelength of 1064 nm. For example, seed light sources with different wavelengths, such as 1030 nm, 1550 nm, and 976 nm, may be selected as appropriate for different applications.

Furthermore, these wavelengths may be used as fundamental waves to generate harmonics, sum frequencies, and difference frequencies through the nonlinear optical element. A nonlinear optical element different from that described above may be used. For example, a BBO crystal, a KBBF crystal, an SBBO crystal, a KABO crystal, a BABO crystal, or the like may be used instead of the CLBO crystal.

As described above, the control unit 100 executes the laser pulse light generating method in which the pulse light output from a seed light source based on gain switching is sequentially amplified by the fiber amplifier and the solid state amplifier, subjected to the wavelength conversion by the nonlinear optical element, and then is output.

That is, the laser pulse light generating method includes driving the seed light source at a desired pulse rate, and controlling the injection current to the semiconductor optical amplifier disposed between the seed light source and the solid state amplifier depending on the pulse rate of the seed light source.

Specifically, the injecting timing of the injection current is controlled in such a manner that the pulse light, output from the seed light source and subjected to the wavelength conversion by the nonlinear optical element, achieves the predetermined intensity. Furthermore, the value of the injection current is controlled in such a manner that the pulse light, output from the seed light source and subjected to the wavelength conversion by the nonlinear optical element, achieves the predetermined intensity.

Furthermore, the value of the injection current is controlled in such a manner that the solid state amplifier enters the predetermined excitation state. Still further, the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

Still further, the pulse rate of the seed light source is set and the injection current to the semiconductor optical amplifier is controlled depending on the pulse light output from the nonlinear optical element, the processing target to be processed by the pulse light, and/or the relative moving speed between the pulse light and the processing target.

Each of the plurality of embodiments described above is described as one embodiment of the present invention, and the scope of the present invention is not limited by the description. It is a matter of course that the specific circuit configurations of each component and optical elements used for circuits may be selected as appropriate or designed differently as long as the effects of the present invention are obtained.

The invention claimed is:

1. A laser light-source apparatus comprising:
a seed light source configured to output pulse light based on gain switching;
a fiber amplifier configured to amplify the pulse light output from the seed light source;
a solid state amplifier configured to amplify the pulse light output from the fiber amplifier;
a nonlinear optical element configured to perform wavelength conversion on the pulse light output from the solid state amplifier and output the resultant pulse light;
a semiconductor optical amplifier disposed between the seed light source and the solid state amplifier and configured to amplify the pulse light output from the seed light source; and
a control unit configured to execute gain switching control processing in which the seed light source is driven at a desired pulse rate, and semiconductor optical amplifier control processing in which an injection current to the semiconductor optical amplifier is controlled depending on the pulse rate of the seed light source.

2. The laser light-source apparatus according to claim 1, wherein the semiconductor optical amplifier control processing includes processing in which injecting timing of the injection current is controlled in such a manner that the pulse light, output from the seed light source and subjected to the wavelength conversion by the nonlinear optical element, achieves predetermined intensity.

3. The laser light-source apparatus according to claim 2, wherein the semiconductor optical amplifier control processing includes processing in which a value of the injection current is controlled in such a manner that the pulse light, output from the seed light source and subjected to the wavelength conversion by the nonlinear optical element, achieves the predetermined intensity.

4. The laser light-source apparatus according to claim 2, wherein the semiconductor optical amplifier control processing includes processing in which the value of the injection current is controlled in such a manner that the solid state amplifier enters a predetermined excitation state.

5. A laser light-source apparatus according to claim 2, wherein the semiconductor optical amplifier control processing includes processing in which the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

6. The laser light-source apparatus according to claim 2, wherein the gain switching control processing includes processing in which the pulse rate of the seed light source is set in real time depending on the pulse light output from the nonlinear optical element, a processing target to be processed by the pulse light, and/or relative moving speed between the pulse light and the processing target, and
wherein the semiconductor optical amplifier control processing includes processing in which the injection current to the semiconductor optical amplifier is controlled depending on the pulse light output from the nonlinear optical element, the processing target to be processed by the pulse light, and/or the relative moving speed between the pulse light and the processing target.

7. The laser light-source apparatus according to claim 1, wherein the semiconductor optical amplifier control processing includes processing in which a value of the injection current is controlled in such a manner that the pulse light, output from the seed light source and subjected to the wavelength conversion by the nonlinear optical element, achieves predetermined intensity.

8. The laser light-source apparatus according to claim 7, wherein the semiconductor optical amplifier control processing includes processing in which the value of the injection current is controlled in such a manner that the solid state amplifier enters a predetermined excitation state.

9. The laser light-source apparatus according to claim 7, wherein the semiconductor optical amplifier control processing includes processing in which the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

10. The laser light-source apparatus according to claim 1, wherein the semiconductor optical amplifier control processing includes processing in which the value of the injection current is controlled in such a manner that the solid state amplifier enters a predetermined excitation state.

11. The laser light-source apparatus according to claim 1, wherein the semiconductor optical amplifier control processing includes processing in which the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

12. The laser light-source apparatus according to claim 1, wherein the gain switching control processing includes processing in which the pulse rate of the seed light source is set in real time depending on the pulse light output from the nonlinear optical element, a processing target to be processed by the pulse light, and/or relative moving speed between the pulse light and the processing target, and
wherein the semiconductor optical amplifier control processing includes processing in which the injection current to the semiconductor optical amplifier is controlled depending on the pulse light output from the nonlinear optical element, the processing target to be processed by the pulse light, and/or the relative moving speed between the pulse light and the processing target.

13. The laser light-source apparatus according to claim 1, wherein the control unit is configured to further execute excitation control processing in which an excitation light source for the fiber amplifier and/or the solid state amplifier is periodically or intermittently controlled in such a manner that the fiber amplifier and/or the solid state amplifier enters a population inversion state before receiving the pulse light output from the seed light source, when the pulse rate of the seed light source is equal to or lower than a predetermined frequency.

14. The laser light-source apparatus according to claim 1, wherein the seed light source includes a distributed feedback (DFB) laser, and
wherein the control unit is configured to drive the DFB laser at a pulse rate of several megahertz or lower and with a pulse width of several hundreds of picoseconds or shorter.

15. A laser pulse light generating method in which pulse light output from a seed light source based on gain switching is sequentially amplified by a fiber amplifier and a solid state amplifier, subjected to wavelength conversion by a nonlinear optical element, and then is output, the method comprising:
driving the seed light source at a desired pulse rate; and
controlling an injection current to a semiconductor optical amplifier, disposed between the seed light source and the solid state amplifier, depending on the pulse rate of the seed light source.

16. The laser pulse light generating method according to claim 15,
wherein injecting timing of the injection current is controlled in such a manner that the pulse light, output from the seed light source and subjected to the wavelength conversion by the nonlinear optical element, achieves predetermined intensity.

17. The laser pulse light generating method according to claim 15,
wherein a value of the injection current is controlled in such a manner that the pulse light, output from the seed light source and subjected to the wavelength conversion by the nonlinear optical element, achieves predetermined intensity.

18. The laser pulse light generating method according to claim 15,
wherein the value of the injection current is controlled in such a manner that the solid state amplifier enters a predetermined excitation state.

19. The laser pulse light generating method according to claim 15,
wherein the value of the injection current is controlled when no pulse light is input in such a manner that the value is raised in a stepwise manner or continuously as the pulse rate of the pulse light output from the seed light source declines, and the value is lowered in a stepwise manner or continuously as the pulse rate of the pulse light output from the seed light source rises.

20. The laser pulse light generating method according to claim 15,
wherein the pulse rate of the seed light source is set and the injection current to the semiconductor optical amplifier is controlled depending on the pulse light output from the nonlinear optical element, a processing target to be processed by the pulse light, and/or relative moving speed between the pulse light and the processing target.

* * * * *